United States Patent
Lim et al.

(10) Patent No.: US 9,653,365 B1
(45) Date of Patent: May 16, 2017

(54) METHODS FOR FABRICATING INTEGRATED CIRCUITS WITH LOW, MEDIUM, AND/OR HIGH VOLTAGE TRANSISTORS ON AN EXTREMELY THIN SILICON-ON-INSULATOR SUBSTRATE

(71) Applicant: Globalfoundries Singapore Pte. Ltd., Singapore (SG)

(72) Inventors: Khee Yong Lim, Singapore (SG); Jae Han Cha, Singapore (SG); Chia Ching Yeo, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/093,888

(22) Filed: Apr. 8, 2016

(51) Int. Cl.
*H01L 21/00* (2006.01)
*H01L 21/84* (2006.01)
*H01L 21/8234* (2006.01)

(52) U.S. Cl.
CPC ...... *H01L 21/84* (2013.01); *H01L 21/823418* (2013.01); *H01L 21/823481* (2013.01)

(58) Field of Classification Search
None
See application file for complete search history.

(56) References Cited

U.S. PATENT DOCUMENTS

| 7,202,123 | B1 | 4/2007 | Pan |
| 7,652,332 | B2 | 1/2010 | Cartier et al. |
| 2011/0227159 | A1 | 9/2011 | Chan et al. |
| 2015/0054081 | A1* | 2/2015 | Adam ............... H01L 21/84 |
| | | | 257/350 |

* cited by examiner

*Primary Examiner* — Julio J Maldonado
*Assistant Examiner* — Stanetta Isaac
(74) *Attorney, Agent, or Firm* — Lorenz & Kopf, LLP (57) ABSTRACT

A method for fabricating an integrated circuit that include providing or obtaining an extremely thin silicon-on-insulator (ETSOI) substrate, dividing the ETSOI substrate into a low voltage field effect transistor (FET) region and one or both of a medium voltage FET region and a high voltage FET regions, and forming a low voltage FET within the low voltage FET regions and forming a medium and/or high voltage FET within the medium and/or high voltage FET region(s). Channel, source, and drain structures of the low voltage FET are formed in an upper silicon layer that is disposed above a buried oxide layer of the ETSOI substrate, whereas channel, source, and drain structures of the medium and/or high voltage FETs are formed at least partially below the upper silicon layer.

17 Claims, 5 Drawing Sheets

METHODS FOR FABRICATING INTEGRATED CIRCUITS WITH LOW, MEDIUM, AND/OR HIGH VOLTAGE TRANSISTORS ON AN EXTREMELY THIN SILICON-ON-INSULATOR SUBSTRATE

TECHNICAL FIELD

The present disclosure generally relates to the design and fabrication of integrated circuits. More particularly, the present disclosure relates to methods for fabricating integrated circuits with low, medium, and/or high voltage transistors on an extremely thin silicon-on-insulator (ETSOI) substrate.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which current can flow. A control voltage applied to the gate electrode controls the flow of current through an underlying channel between the source and drain regions.

The design of ever-smaller FETs with short channel lengths makes it desirable to minimize the depth of the source/drain junctions to thereby provide shallow junctions. Shallow junctions are desirable to avoid lateral diffusion of implanted dopants into the channel, since such diffusion contributes to leakage of current and poor breakdown performance. Silicon-on-insulator (SOI) technology allows the formation of high-speed, shallow-junction devices. In addition, SOI devices improve performance by reducing parasitic junction capacitance.

In an SOI substrate, a buried oxide (BOX) film made of silicon oxide is formed on single crystal silicon, and a single crystal silicon thin film of silicon is formed on the buried oxide film. A more recent variation of the SOI substrate is the so-called "extremely thin" SOI (ETSOI) substrate. ETSOI substrates may be used to form fully depleted charge carrier transistor devices (i.e., having a concentration of charge carriers present in the channel on the order of $10^3$ atoms/cm$^3$ or less), and use an extremely-thin silicon channel (for example from about 3 nm to 20 nm in thickness), wherein the majority of carriers are fully depleted (FD) during operation.

ETSOI substrates, however, due to their thin channels, can only support FETs that operate at less than about 5 volts (V) (i.e., "low voltage" transistors). This is due to the fact that a high electric field is generated in the thin channel at higher voltages, which can cause parasitic capacitance between FETs and device performance problems. Thus, integrated circuits that require both low voltage FETs and/or medium voltage (i.e., operating from about 5 volts to about 20 volts) and/or high voltage (i.e., operating above about 20 volts) FETs have heretofore not been able to take advantage of the scaling benefits of ETSOI substrates.

Accordingly, it is desirable to provide methods for fabricating integrated circuits on ETSOI substrates that include low voltage FETs in addition to medium and/or high voltage FETs. Additionally, it is desirable to provide methods for the fabrication of such integrated circuits that are easily integrated into existing process flow schemes used in semiconductor fabrication facilities. Furthermore, other desirable features and characteristics of the present disclosure will become apparent from the subsequent detailed description and the appended claims, taken in conjunction with the accompanying drawings and the foregoing technical field and background.

BRIEF SUMMARY

Accordingly, the present disclosure generally relates to methods for fabricating integrated circuits with low, medium, and/or high voltage transistors on an extremely thin silicon-on-insulator substrate. In one embodiment, a method for fabricating an integrated circuit includes providing or obtaining an extremely thin silicon-on-insulator (ETSOI) substrate, dividing the ETSOI substrate into a low voltage field effect transistor (FET) region and a medium voltage FET region, and forming a low voltage FET within the low voltage FET region, and forming a medium voltage FET within the medium voltage FET region. Channel, source, and drain structures of the low voltage FET are formed only in an upper silicon layer of the ETSOI substrate that is disposed above a buried oxide layer of the ETSOI substrate. Further, channel, source, and drain structures of the medium voltage FET are formed at least partially below the upper silicon layer.

In another embodiment, a method for fabricating an integrated circuit includes providing or obtaining an extremely thin silicon-on-insulator (ETSOI) substrate, dividing the ETSOI substrate into a low voltage field effect transistor (FET) region and a high voltage FET region, and forming a low voltage FET within the low voltage FET region and forming a high voltage FET within the high voltage FET voltage region. Channel, source, and drain structures of the low voltage FET are formed in an upper silicon layer of the ETSOI substrate that is disposed above a buried oxide layer of the ETSOI substrate. Further, channel, source, and drain structures of the high voltage FET are formed at least partially below the upper silicon layer.

In yet another embodiment, a method for fabricating an integrated circuit includes providing or obtaining an extremely thin silicon-on-insulator (ETSOI) substrate, dividing the ETSOI substrate into a low voltage field effect transistor (FET) region, a medium voltage FET region, and a high voltage FET region, and forming a low voltage FET within the low voltage FET region, forming a medium voltage FET within the medium voltage FET region, and forming a high voltage FET within the high voltage FET voltage region. Channel, source, and drain structures of the low voltage FET are formed in an upper silicon layer of the ETSOI substrate that is disposed above a buried oxide layer of the ETSOI substrate. Further, channel, source, and drain structures of the medium and high voltage FETs are formed at least partially below the upper silicon layer.

This brief summary is provided to introduce a selection of concepts in a simplified form that are further described below in the detailed description. This brief summary is not intended to identify key features or essential features of the claimed subject matter, nor is it intended to be used as an aid in determining the scope of the claimed subject matter

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to methods for fabricating integrated circuits with a low voltage transistor in addition to a medium, and/or high voltage transistor on an extremely thin silicon-on-insulator (ETSOI) substrate. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

Figure 1:
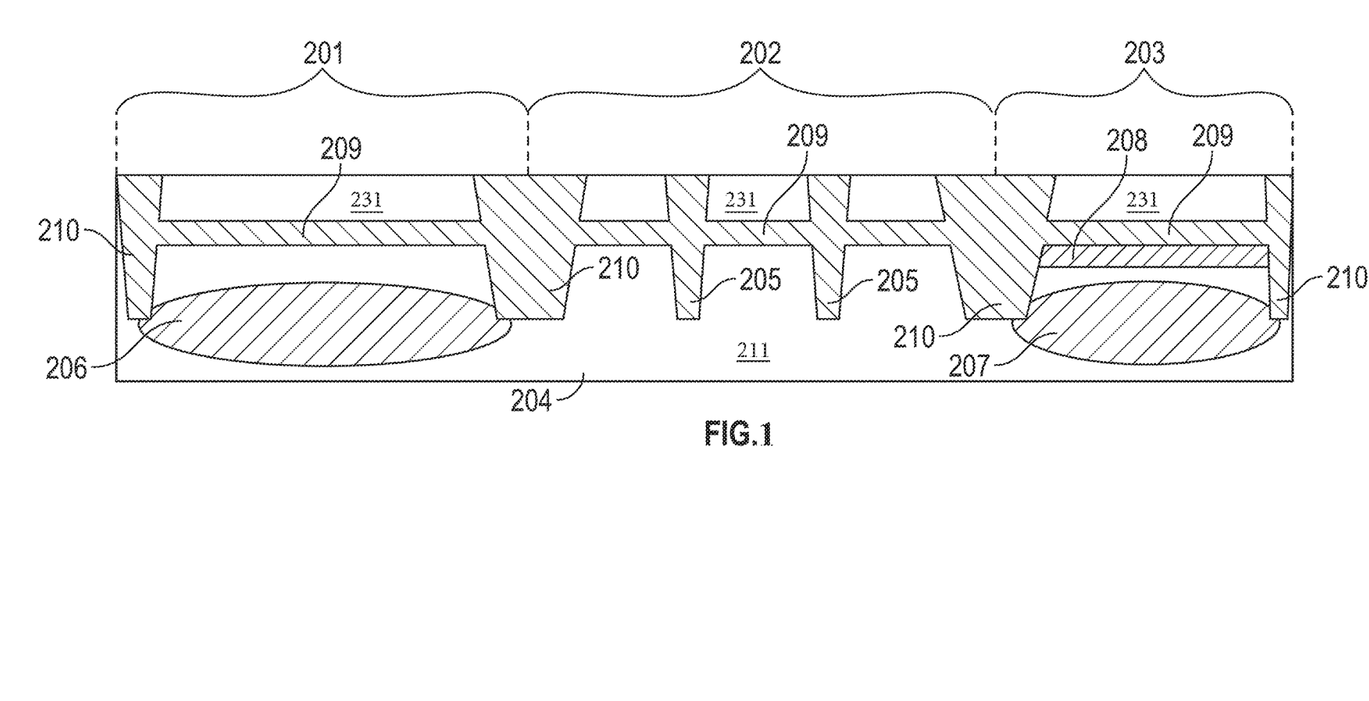
FIGS. 1-9 illustrate, in cross-section, integrated circuit structures and methods for fabricating integrated circuit structures including low, medium, and/or high voltage transistor on an ETSOI substrate in accordance with embodiments of the present disclosure.

FIGS. 1-9 illustrate, in cross-section, integrated circuit structures and methods for fabricating integrated circuit structures including low, medium, and/or high voltage transistor on and in an ETSOI substrate in accordance with embodiments of the present disclosure. Referring first to FIG. 1, the exemplary methods begin with providing or obtaining an ETSOI substrate 204. ETSOI substrate 204 includes a silicon base layer 211 (for example, p-type doped silicon), a silicon dioxide buried oxide ("BOX") insulating layer 209 disposed over and in contact with the silicon base layer 211, and an extremely thin (i.e., about 3 nm to about 20 nm in thickness, such as about 5 nm to about 15 nm in thickness) upper silicon layer 231 (also, for example, p-type doped silicon) disposed over and in contact with the BOX insulating layer 209. ETSOI substrate 204 may be formed using conventional methods, such as separation by implantation of oxygen ("SIMOX") processing, which uses an oxygen ion beam implantation process followed by high temperature annealing to create the BOX insulating layer 209 at an appropriate depth in a p-type bulk silicon substrate, thereby separating the bulk silicon substrate into silicon base layer 211 and upper silicon layer 231. Accordingly, the method step disclosed in FIG. 1 may be understood as disclosing providing or obtaining an extremely thin silicon-on-insulator (ETSOI) substrate 204. The ETSOI substrate 204 includes the silicon base layer 211, the buried oxide (BOX) insulating layer 209, which is disposed over and in physical contact with the silicon base layer 211, and the upper silicon layer 231, which is disposed over and in physical contact with the BOX insulating layer 209, wherein the upper silicon layer 231 has a thickness above the BOX insulating layer of about from 3 nm to about 20 nm.

Once the ETSOI substrate 204 has been provided or obtained, FIG. 1 further illustrates the formation of a plurality of insulating shallow trench isolation structures 205, 210. STI structures 205, 210 are formed of a suitable insulating material such as silicon dioxide, and may be formed using conventional techniques such as forming a plurality of trenches in ETSOI substrate 204 (i.e., with patterning and etching techniques) and filling such trenches with the silicon dioxide material. In the embodiment as shown, the STI structures 210 delineate three separate FET regions 201, 202, and 203. In FET region 201, a medium voltage (i.e., operating at about 5V to about 20V) FET structure will be formed, in FET region 202, a high voltage (i.e., operating at above about 20V) FET structure will be formed, and in FET region 203, a low voltage (i.e., operating at less than about 5V) FET structure will be formed. STI structures 205 form part of the high voltage FET structure, as will be described in greater detail below. Accordingly, the method step disclosed in FIG. 1 may further be understood as disclosing dividing the ETSOI substrate 204 into a low voltage field effect transistor (FET) region 203, a medium voltage FET region 201, and a high voltage FET region 202. Particularly, this step includes forming a plurality of first shallow trench isolation (STI) structures 210 in the ETSOI substrate 204, the STI structures 210 dividing the ETSOI substrate 204 into the low voltage field effect transistor region 203, the medium voltage FET region 201, and the high voltage FET region 202. Also this method step includes forming two second STI structures 205 within the high voltage FET region 202. However, it is to be appreciated that any combination of the various regions may be formed in accordance with the present disclosure.

FIG. 1 also illustrates the formation of various ion implant bands or wells 206, 207, 208. These ion implant bands or wells may be formed before or after forming the BOX insulating layer 209, and before or after forming the STI structures 205, 210. Conventional ion implantation techniques may be used to form bands or wells 206, 207, 208. As shown, an ion implant band 206 may be formed within the silicon base layer 204 of the medium voltage FET region 201, and at a depth that is approximately commensurate with the bottom of STI structures 210. Ion implant band 207 may be formed within the silicon base layer 204 of the low voltage FET region 203, and at a depth that is approximately commensurate with the bottom of STI structures 210. Further, ion implant well 208 may be formed directly underneath and in contact with the BOX insulating layer 209 in the silicon base layer 211 of the low voltage FET device 203, and separated from implant band 207. For a p-type ETSOI substrate 204, implant bands 206 and 207 may be of the n-type, and well 208, which may be referred to as a "back well," may be of the p-type.

Figure 2:
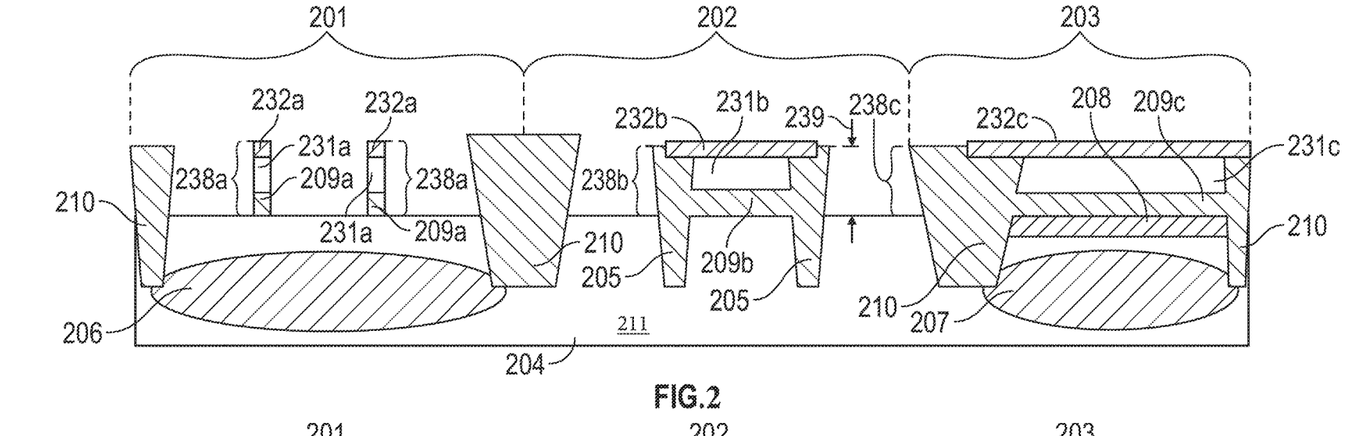

Referring now to FIG. 2, a hardmask layer including, for example, silicon nitride, may be patterned onto ETSOI substrate 204 in three segments: patterned hardmask segments 232a within medium voltage FET region 201, patterned hardmask segment 232b within high voltage FET region 202, and patterned hardmask segment 232c within low voltage FET region 203. Patterned hardmask segments 232a are provided as two individual, narrow segments within regions 201. Patterned hardmask segment 232b spans the area of FET region 202 between the STI structures 205, with regions between STI structures 205 and adjacent STI structures 210 free of the hardmask segment 2332b. Further, patterned hardmask segment 232c spans an entirety of FET region 203 between the respective STI structures 210. The hardmask segments 232a, 232b, 232c may be deposited and patterned using conventional deposition (such as chemical or physical vapor deposition (CVD, PVD)) and patterning techniques (such as photolithographic patterning using a photoresist material). Accordingly, the method step disclosed in FIG. 2 may be understood as disclosing forming first, second, and third patterned hardmask segments 232c, 232a, 232b over the ETSOI substrate 204, the first masking layer segment 232c including a segment formed over an entirety of the low voltage FET region 203, the second masking layer segment 232a including two spaced apart segments formed over the medium voltage FET region 201, the third masking layer segment 232b including a segment formed only between the two second STI structures 205 in the high voltage FET region 202.

With continued reference to FIG. 2, the patterned hardmask segments 232a, 232b, 232c may serve as an etch mask for etching of the underlying upper silicon layer 231 of the ETSOI substrate 204. Etching may be performed so as to etch through the upper silicon layer 231 as well as the BOX insulating layer 209 to a depth 239 within ETSOI substrate 204. Etching may be performed using any suitable wet or dry etching techniques in an anisotropic manner, such that portions of the upper silicon layer 231 and the BOX insulating layer remain disposed below the patterned hardmask segments 232a, 232b, 232c. Those remaining portions of the upper silicon layer 231 underneath patterned hardmask segments 232a, 232b, and 232c will hereinafter be referred to as upper silicon segments 231a, 231b, and 231c, respectively, and those remaining portions of the BOX insulating layer 209 underneath hardmask segments 232a, 232b, and 232c will hereinafter be referred to as BOX segments 209a, 209b, and 209c, respectively. Other areas of layers 231 and 209 not underneath a patterned hardmask segment 232a, 232b, 232c are etched away. Thus, remaining in medium voltage FET region 201 are two "stacks" 238a formed of BOX segments 209a, upper silicon segments 231a, and hardmask segments 232a. Remaining in high voltage FET region 202, and disposed between the STI structures 205, is a "stack" 238b formed of BOX segment 209b, upper silicon segment 231b, and hardmask segment 232b. Further, remaining in low voltage FET regions 203, and disposed between the respective STI structures 210, is a "stack" 238c formed of BOX segment 209c, upper silicon segment 231c, and hardmask segment 232c. Accordingly, the method step disclosed in FIG. 2 may be further understood as disclosing removing portions of the upper silicon layer 231 and the BOX insulating layer 209 that are not beneath the first, second, and third patterned hardmask segments 232c, 232a, 232b, thereby forming two first stacks 238a including segments of the BOX insulating layer 209a and the upper silicon layer 231a in the medium voltage FET region 201 and a second stack 238b including a segment of the BOX insulating layer 209b and the upper silicon layer 231b in the high voltage FET region 202 and between the two second STI structures 205.

Figure 3:
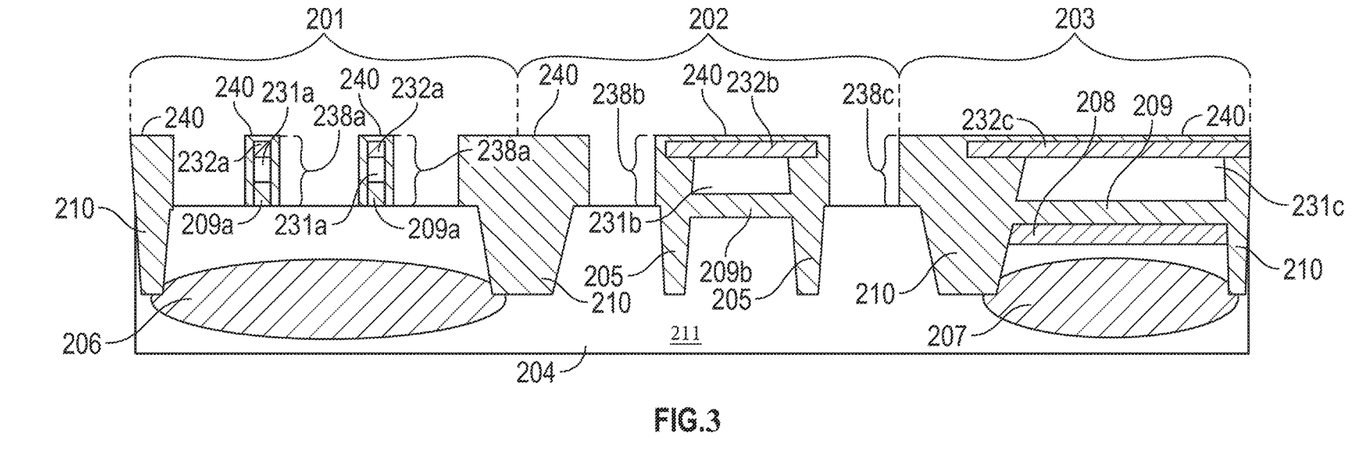

Referring now to FIG. 3, a spacer layer formed of, for example, silicon dioxide, is formed over each of the stacks 238a, 238b, 238c. For this purpose, conventional spacer forming techniques may be employed, such as deposition of a silicon dioxide layer, followed by etching back of silicon dioxide layer using anisotropic dry etching (such as reactive ion etching (RIE)). As a resulting of this process, spacer structures 240 are formed over each of the stacks 238a, 238b, 238c, as well as over the STI structures 205, 210.

Figure 4:
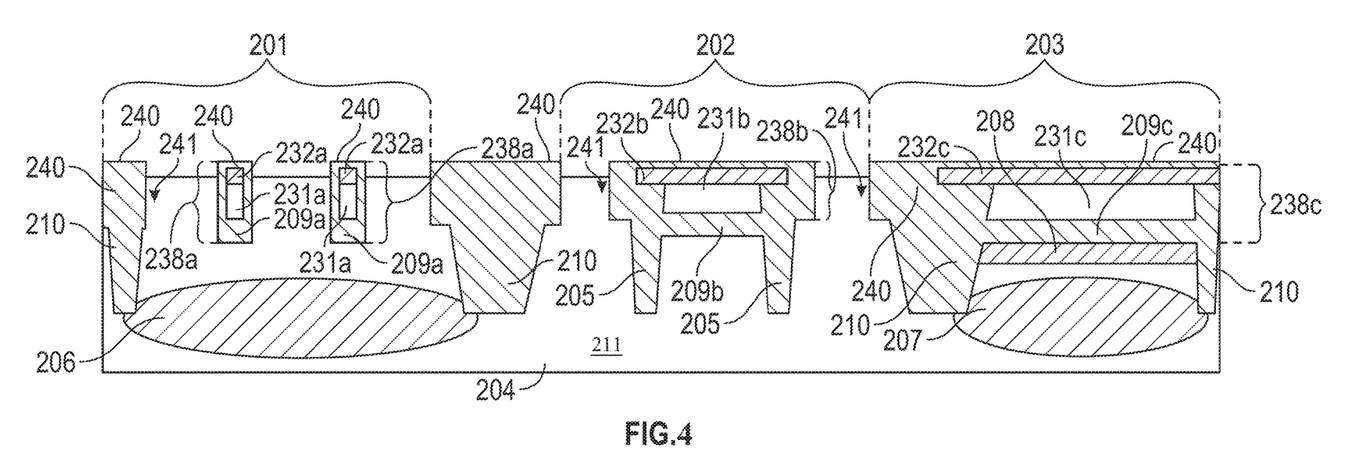

FIG. 4 illustrates the formation of a polycrystalline silicon (polysilicon) layer 241 in the etched void spaces between and adjacent to the stacks 238a, 238b, 238c that were previously etched as described above with regard to FIG. 2. The formation of the polysilicon layer 241 may be accomplished using epitaxial growth techniques, where the silicon base layer 211 serves as a substrate for the epitaxial growth of polysilicon. Alternative, formation of the polysilicon layer 241 may be accomplished using conventional CVD techniques, followed by chemical mechanical planarization (CMP). The polysilicon layer 241 may be formed to a height that is commensurate with the spacer structures 240. Accordingly, the method step disclosed in FIG. 4 may be understood as disclosing forming a polycrystalline silicon layer 241 within the medium voltage FET region 201 between and adjacent to the two first stacks 238a and within the high voltage region 202 adjacent to the second stack 238b, the polycrystalline silicon layer 241 being formed to a height commensurate with the upper silicon layer 231.

Figure 5:
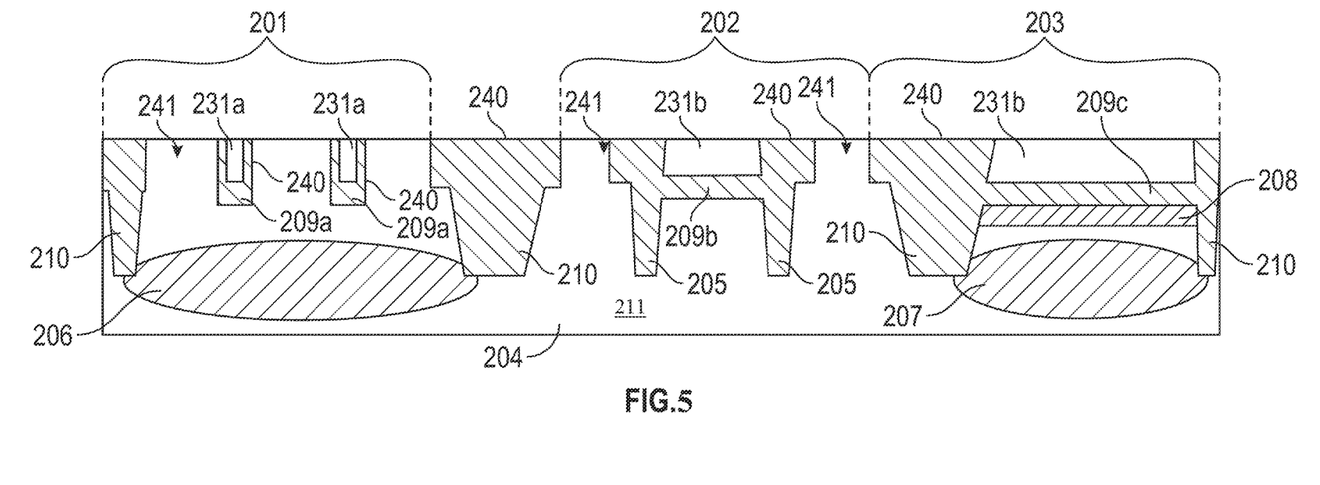

With reference now to FIG. 5, CMP may be performed to planarize the ETSOI substrate 204 down to the level of the upper silicon segments 231a, 231b, 231c, and thereby expose all of the upper silicon segments 231a, 231b, 231c. In this manner, the CMP process removes upper portions of the STI structures 205, 210, upper portions of the space structures 240, upper portions of the polysilicon layer 241, and all of the patterned hardmask segments 232a, 232b, 232c. Thus, after the CMP process, an exposed upper surface of the ETSOI substrate includes upper surfaces of the STI structures 205, 210, upper surfaces of the polysilicon layer 241, upper surfaces of the upper silicon segments 231a, 231b, 231c, and upper surfaces of the spacer structures 240, as illustrated. Accordingly, the method step disclosed in FIG. 5 may be understood as disclosing removing the first, second, and third masking layer segments 232c, 232a, 232b from over the ETSOI substrate 204.

Figure 6:
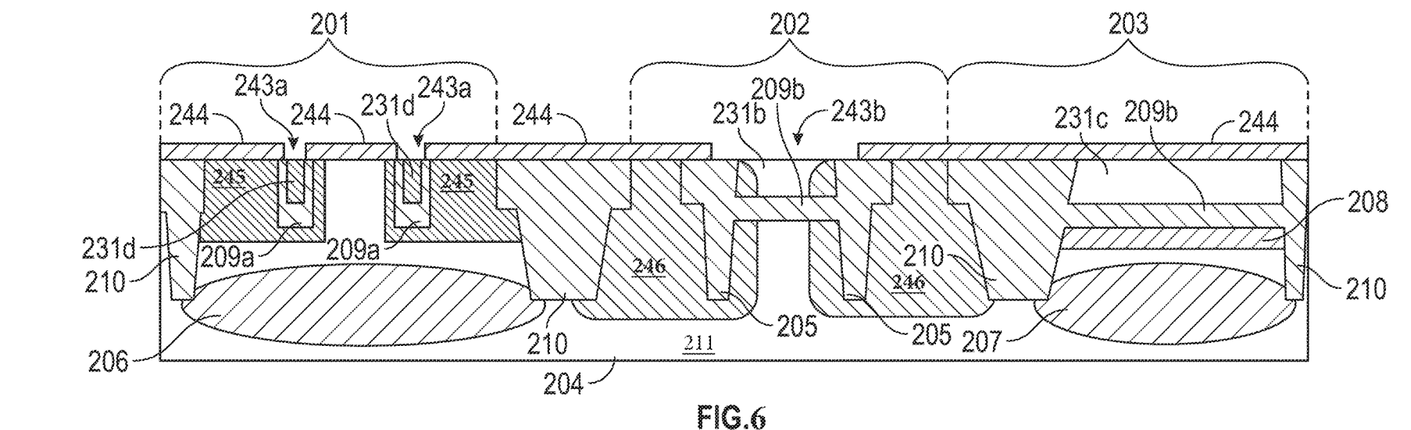

Turning now to FIG. 6, additional ion implantation procedures are performed, using conventional ion implantation processes. In the medium voltage FET region 201, n-type source/drain regions 245 are formed by the implantation of n-type ions in polysilicon layer 241 adjacent to the STI structures 210 defining region 201, and throughout the area between the STI structures 210 and the spacer structures 240 adjacent to BOX segments 209a and upper silicon segments 231a. N-type ions are also implanted into base Si layer 211 underneath each BOX segment 209a (but not extending all the way to n-type band 206—as such the doping only extends about half way along the height of each STI structure 210), and adjacent to the spacer structures 240 in the area between the two BOX segments 209a and the two upper silicon segments 231a. However, the doping does not extend all the way throughout the area between the two BOX segments 209a and the two upper silicon segments 231a. Rather, that area is left as p-type doped substrate, thus forming the channel region of the medium voltage FET to be formed. Given that upper silicon segments 231a also form a portion of the upper surface of ETSOI substrate 204, these segments 231a will also be doped during the doping process, and are thus now referred to as doped upper silicon segments 231d.

As further shown in FIG. 6, in the high voltage FET region 202, n-type source/drain regions 246 are formed by the implantation of n-type ions into polysilicon layer 241 and further into silicon base layer 211 adjacent to the STI structures 210 defining region 202, and throughout the area between the STI structures 210 and the STI structures 205 within region 202. N-type ions are also implanted underneath each STI structure 205, and adjacent to each STI structure 205 in the area between the two STI structures 205. However, the doping does not extend all the way throughout the area between the two STI structures 205, underneath the BOX segment 209b. Rather, that area is left as p-type doped substrate, thus forming the channel region of the high voltage FET to be formed. It should also be noted that some n-type doping may occur in upper silicon segment 231b, particularly adjacent to the STI structures 205. Two separate doping steps may be performed to achieve the doping in the medium voltage FET region 201 and the high voltage FET region 202. While an NFET device is described in this paragraph, it should also be appreciated that PFET embodiments are possible as well, in which case the instances of n-type doping mentioned above would be p-type, and so forth.

FIG. 6 also illustrates the formation of a patterned hard mask layer 244, made of silicon nitride for example, which is patterned over certain areas of each of FET regions 201, 202, 203. In particular, patterned hard mask layer 244 is patterned over all portions of medium voltage FET region 201 except over the doped upper silicon segments 231d (shown as openings 243a). Patterned hard mask layer 244 may be formed over all portions of high voltage FET regions 202 except over the upper silicon segment 231b (shown as opening 243b). Further, patterned hard mask layer 244 may be formed over all portions of low voltage FET region 203. Conventional deposition, masking, and photolithographic patterning techniques may be used for form patterned hard mask layer 244. Accordingly, the method step disclosed in FIG. 6 may be understood as disclosing forming source and drain ion implant regions 245, 246 within the medium voltage FET region 210 and the high voltage FET region 202, wherein forming the source and drain ion implant regions 245 in the medium voltage FET region 201 includes forming the source and drain ion implant regions 245 adjacent to and underneath the two first stacks 238a, and wherein forming the source and drain ion implant regions 246 in the high voltage FET region 202 includes forming the source and drain ion implant regions 246 adjacent to and underneath the two second STI structures 205.

Figure 7:
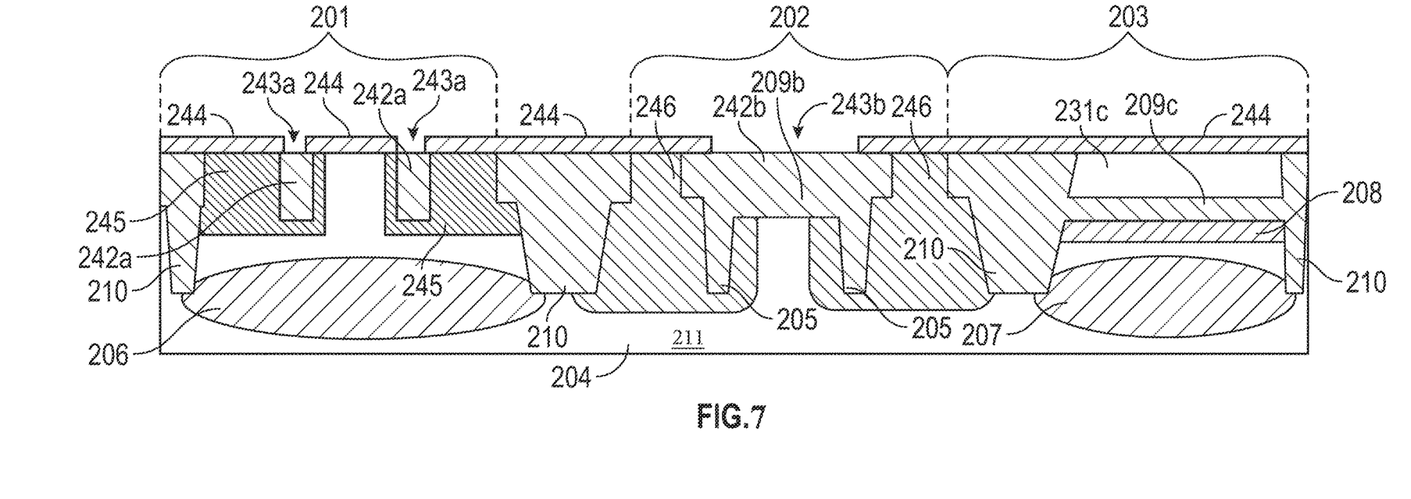

Turning now to FIG. 7, the openings 243a, 243b in the patterned hardmask layer 244, namely over the doped upper silicon segments 231d and the upper silicon segment 231b, are exposed to an oxidizing environment (such as $O_2$ or $O_3$ gas) at elevated temperatures (e.g., greater than about 200° C.) for a period of time (e.g., about 15 minutes or greater). In this manner, the exposed silicon in these segments 231d, 231b is oxidized to form silicon dioxide segments 242a, 242b, respectively. Thus, in medium voltage FET region 201, the silicon dioxide segments 242a form continuous silicon dioxide structures with the underlying BOX segments 209a and the surrounding spacer structures 240. Further, in the high voltage FET region 202, the silicon dioxide segment 242b forms a continuous silicon dioxide structure with the underlying BOX segment 209b, the surrounding spacer structures 240, and the adjacent STI structures 205. Accordingly, the method step disclosed in FIG. 7 may be understood as disclosing oxidizing the (doped) segments 231d of the upper silicon layer in the two first stacks 238a and oxidizing the segment 231b of the upper silicon layer in the second stack 238b.

Figure 8:
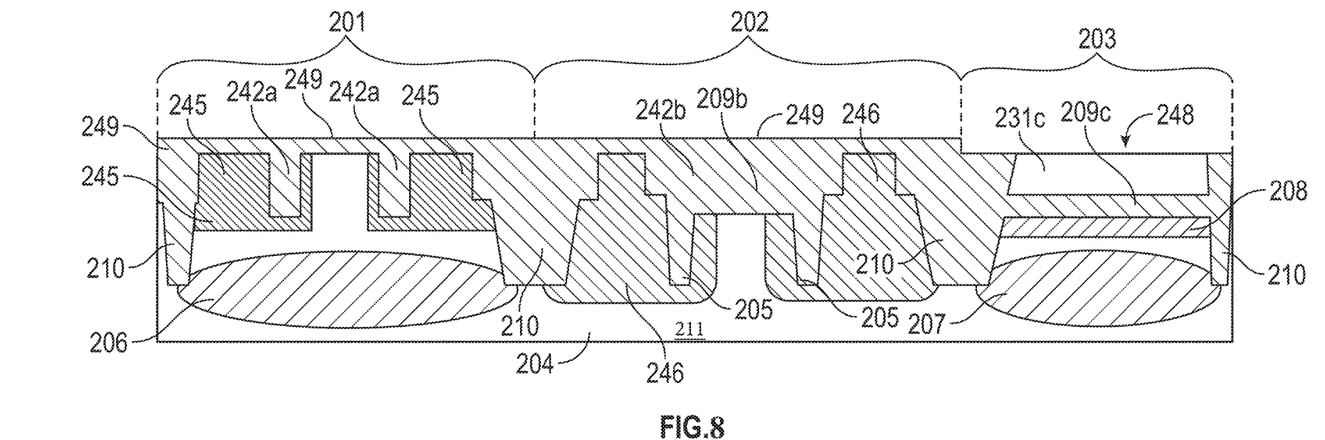

Referring now to FIG. 8, the patterned hard mask layer 244 is removed (for example by a suitable etching or planarization technique) and a silicon dioxide masking layer 249 is disposed over an entirety of the medium voltage FET region 201 and the high voltage FET region 202, but not over any of the low voltage FET region 203, thus leaving upper silicon segment 231c exposed. Silicon dioxide masking layer 249 may be formed using any suitable deposition technique to a thickness of about 200 to about 300 Angstroms.

Figure 9:
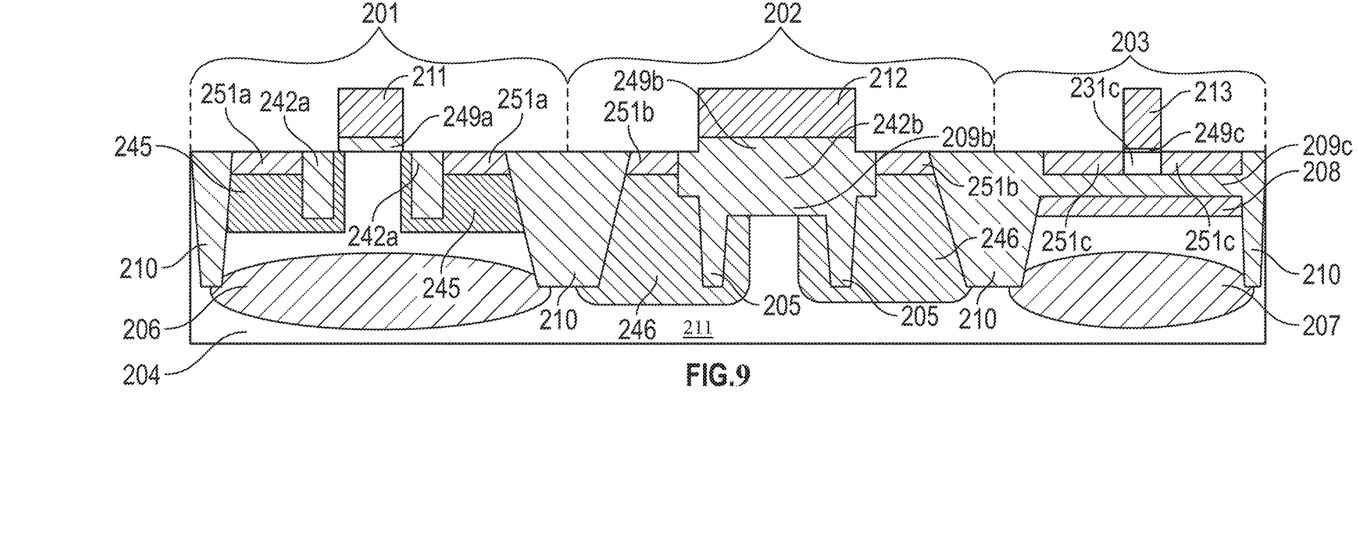

Turning to FIG. 9, with FET regions 201 and 202 masked using layer 249, completion of the low voltage FET structure in the ETSOI substrate may be accomplished. For example, as is conventional, source/drain regions 251c are formed above the BOX segment 209c in the extremely thin upper silicon segment 231c, so as to define a channel region therebetween, and a gate stack including a gate dielectric layer 249c and a gate electrode 213 are formed over the upper silicon segment 231c and between the source/drain regions 251c. As further shown in FIG. 9, after the low voltage FET has been formed in region 203, the silicon dioxide masking layer 249 may be removed from over FET regions 201 and 202 (using a suitable etching technique), and the completion of the medium and high voltage FETs may be accomplished. In this manner, gate dielectric layers 249a, 249b are formed over respective channels of the FET regions 201, 202, and gate electrodes 211, 212 are formed over respective gate dielectric layers 249a, 249b. As shown in FIG. 9, all three of a low voltage FET, a medium voltage FET, and a high voltage FET have been formed on an ETSOI substrate. Accordingly, the method step illustrated in FIG. 9 may be characterized as forming a low voltage FET within the low voltage FET region 203, forming a medium voltage FET within the medium voltage FET region 201, and forming a high voltage FET within the high voltage FET voltage region 202. Channel, source, and drain structures of the low voltage FET are formed in an upper silicon layer of the ETSOI substrate that is disposed above a buried oxide layer of the ETSOI substrate, and channel, source, and drain structures of the medium and high voltage FETs are formed at least partially below the upper silicon layer. Accordingly, the method step disclosed in FIG. 9 may be understood as disclosing masking the medium and high voltage FET regions 201, 202 (using, for example, masking layer 249) while forming a first gate electrode structure (249c/213) over the low voltage FET region 203, thereby forming a low voltage FET over the ETSOI 204, and un-masking the medium and high voltage FET regions 201, 202 then forming second and third gate structures (249a/211, 249b/212) over the medium and high voltage FET regions 201, 202, respectively, thereby forming medium and high voltage FETs over the ETSOI 204.

The integrated circuit including the low, medium, and/or high voltage FET structures, as shown in the embodiment of FIG. 9, may be completed using conventional front end of line (FEOL), middle of line (MOL), and back end of line (BEOL) processing techniques that include, but are not limited to, forming silicide areas over the source, drain, and gate structures, forming contacts to the source, drain, and gate structures, and forming one or more overlying metallization layers for purposes of interconnecting the various FET structures formed on the integrated circuit. Thus, the present disclosure should be understood as included any such further processing steps as are necessary and conventional in the formation of integrated circuits.

Accordingly, the above-described embodiments provide methods for fabricating integrated circuits with low, medium, and/or high voltage transistors on an extremely thin silicon-on-insulator (ETSOI) substrate. The low voltage transistor is able to take advantage of the scaling benefits of the ETSOI substrate, and the medium and high voltage transistors do not suffer from the aforementioned parasitic capacitance and device performance problems. Additionally, the described methods for the fabrication of such integrated circuits are easily integrated into existing process flow schemes used in semiconductor fabrication facilities, as there is no need for unconventional tooling, equipment, or materials (i.e., all the processes described above can be performed using conventional tooling, equipment, and materials).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
    providing or obtaining an extremely thin silicon-on-insulator (ETSOI) substrate;
    dividing the ETSOI substrate into a low voltage field effect transistor (FET) region and a medium voltage FET region; and
    forming a low voltage FET within the low voltage FET region, and forming a medium voltage FET within the medium voltage FET region,
    wherein, channel, source, and drain structures of the low voltage FET are formed in an upper silicon layer of the ETSOI substrate that is disposed above a buried oxide layer of the ETSOI substrate,
    wherein channel, source, and drain structures of the medium voltage FET are formed at least partially below the upper silicon layer, and wherein:
    the ETSOI substrate comprises a silicon base layer, the buried oxide (BOX) insulating layer, which is disposed over and in contact with the silicon base layer, and the upper silicon layer, which is disposed over and in contact with the BOX insulating layer, wherein the upper silicon layer has a thickness above the BOX insulating layer of about 3 nm to about 20 nm; and
    forming the low and medium voltage FETs comprises:
        forming a plurality of first shallow trench isolation (STI) structures in the ETSOI substrate, the first STI structures dividing the ETSOI substrate into a low voltage field effect transistor (FET) region and a medium voltage FET region;
        forming first and second masking layer segments over the ETSOI substrate, the first masking layer segment comprising a segment formed over an entirety of the low voltage FET region, the second masking layer segment comprising two spaced apart segments formed over the medium voltage FET region;
        removing portions of the upper silicon layer and the BOX insulating layer that are not beneath the first and second masking layer segments, thereby forming two first stacks comprising segments of the BOX insulating layer and the upper silicon layer in the medium voltage FET region;
        forming a polycrystalline silicon layer within the medium voltage FET region between and adjacent to the two first stacks, the polycrystalline silicon layer being formed to a height commensurate with the upper silicon layer;
        removing the first and second masking layer segments from over the ETSOI substrate;
        forming source and drain ion implant regions within the medium voltage FET region, wherein forming the source and drain ion implant regions in the medium voltage FET region comprises forming the source and drain ion implant regions adjacent to and underneath the two first stacks;
        oxidizing the segments of the upper silicon layer in the two first stacks;
        masking the medium FET region while forming a first gate electrode structure over the low voltage FET region, thereby forming a low voltage FET over the ETSOI; and
        un-masking the medium voltage FET region then forming a second gate structure over the medium voltage FET region, thereby forming a medium voltage FET over the ETSOI.

2. The method of claim 1, wherein the medium voltage FET region comprises a doped band formed below the channel, source, and drain structures of the medium voltage FET.

3. The method of claim 1, wherein the low voltage FET region comprises a doped band formed below the channel, source, and drain structures of the low voltage FET.

4. The method of claim 1, wherein the first and second masking layer segments comprise silicon nitride.

5. The method of claim 1, wherein the step of masking comprises masking with a silicon dioxide material.

6. The method of claim 1, wherein the silicon base layer comprises p-type silicon and the source and drain ion implant regions of both the low and medium voltage FETs comprise n-type silicon, or wherein the silicon base layer comprises n-type silicon and the source and drain ion implant regions of both the low and medium voltage FETs comprise p-type silicon.

7. A method for fabricating an integrated circuit comprising:
    providing or obtaining an extremely thin silicon-on-insulator (ETSOI) substrate;
    dividing the ETSOI substrate into a low voltage field effect transistor (FET) region and a high voltage FET region; and
    forming a low voltage FET within the low voltage FET region and forming a high voltage FET within the high voltage FET voltage region,
    wherein, channel, source, and drain structures of the low voltage FET are formed in an upper silicon layer of the ETSOI substrate that is disposed above a buried oxide layer of the ETSOI substrate, wherein channel, source, and drain structures of the high voltage FET are formed at least partially below the upper silicon layer, and wherein:

the ETSOI substrate comprises a silicon base layer, the buried oxide (BOX) insulating layer, which is disposed over and in contact with the silicon base layer, and the upper silicon layer, which is disposed over and in contact with the BOX insulating layer, wherein the upper silicon layer has a thickness above the BOX insulating layer of about 3 nm to about 20 nm; and forming the low and high voltage FETs comprises:

forming a plurality of first shallow trench isolation (STI) structures in the ETSOI substrate, the first STI structures dividing the ETSOI substrate into a low voltage field effect transistor (FET) region and a high voltage FET region, and forming two second STI structures within the high voltage FET region;

forming first and second masking layer segments over the ETSOI substrate, the first masking layer segment comprising a segment formed over an entirety of the low voltage FET region, the second masking layer segment comprising a segment formed between the two second STI structures in the high voltage FET region;

removing portions of the upper silicon layer and the BOX insulating layer that are not beneath the first and second masking layer segments, thereby forming a first stack comprising a segment of the BOX insulating layer and the upper silicon layer in the high voltage FET region and between the two second STI structures;

forming a polycrystalline silicon layer within the high voltage region adjacent to the second stack, the polycrystalline silicon layer being formed to a height commensurate with the upper silicon layer;

removing the first and second masking layer segments from over the ETSOI substrate;

forming source and drain ion implant regions within the high voltage FET region, wherein forming the source and drain ion implant regions in the high voltage FET region comprises forming the source and drain ion implant regions adjacent to and underneath the two second STI structures;

oxidizing the segment of the upper silicon layer in the first stack;

masking the high voltage FET region while forming a first gate electrode structure over the low voltage FET region, thereby forming a low voltage FET over the ETSOI; and un-masking the high voltage FET region then forming a second gate structure over the high voltage FET region, thereby forming a high voltage FET over the ETSOI.

8. The method of claim 7, wherein the high voltage FET region comprises a channel formed beneath the BOX insulating layer.

9. The method of claim 7, wherein the low voltage FET region comprises a doped band formed below the channel, source, and drain structures of the medium voltage FET.

10. The method of claim 7, wherein the first and second masking layer segments comprise silicon nitride.

11. The method of claim 7, wherein the step of masking comprises masking with a silicon dioxide material.

12. The method of claim 7, wherein the silicon base layer comprises p-type silicon and the source and drain ion implant regions of both the low and high voltage FETs comprise n-type silicon.

13. A method for fabricating an integrated circuit comprising:

providing or obtaining an extremely thin silicon-on-insulator (ETSOI) substrate;

dividing the ETSOI substrate into a low voltage field effect transistor (FET) region, a medium voltage FET region, and a high voltage FET region; and forming a low voltage FET within the low voltage FET region, forming a medium voltage FET within the medium voltage FET region, and forming a high voltage FET within the high voltage FET voltage region, wherein, channel, source, and drain structures of the low voltage FET are formed in an upper silicon layer of the ETSOI substrate that is disposed above a buried oxide layer of the ETSOI substrate, wherein channel, source, and drain structures of the medium and high voltage FETs are formed at least partially below the upper silicon layer, and wherein:

the ETSOI substrate comprises a silicon base layer, the buried oxide (BOX) insulating layer, which is disposed over and in contact with the silicon base layer, and the upper silicon layer, which is disposed over and in contact with the BOX insulating layer, wherein the upper silicon layer has a thickness above the BOX insulating layer of about 3 nm to about 20 nm; and forming the low, medium, and high voltage FETs comprises:

forming a plurality of first shallow trench isolation (STI) structures in the ETSOI substrate, the STI structures dividing the ETSOI substrate into a low voltage field effect transistor (FET) region, a medium voltage FET region, and a high voltage FET region, and forming two second STI structures within the high voltage FET region;

forming first, second, and third masking layer segments over the ETSOI substrate, the first masking layer segment comprising a segment formed over an entirety of the low voltage FET region, the second masking layer segment comprising two spaced apart segments formed over the medium voltage FET region, the third masking layer segment comprising a segment formed between the two second STI structures in the high voltage FET region;

removing portions of the upper silicon layer and the BOX insulating layer that are not beneath the first, second, and third masking layer segments, thereby forming two first stacks comprising segments of the BOX insulating layer and the upper silicon layer in the medium voltage FET region and a second stack comprising a segment of the BOX insulating layer and the upper silicon layer in the high voltage FET region and between the two second STI structures;

forming a polycrystalline silicon layer within the medium voltage FET region between and adjacent to the two first stacks and within the high voltage region adjacent to the second stack, the polycrystalline silicon layer being formed to a height commensurate with the upper silicon layer;

removing the first, second, and third masking layer segments from over the ETSOI substrate;

forming source and drain ion implant regions within the medium voltage FET region and the high voltage FET region, wherein forming the source and drain ion implant regions in the medium voltage FET region comprises forming the source and drain ion implant regions adjacent to and underneath the two first stacks, and wherein forming the source and drain ion implant regions in the high voltage FET region comprises forming the source and drain ion implant regions adjacent to and underneath the two second STI structures;

oxidizing the segments of the upper silicon layer in the two first stacks and oxidizing the segment of the upper silicon layer in the second stack;

masking the medium and high voltage FET regions while forming a first gate electrode structure over the low voltage FET region, thereby forming a low voltage FET over the ETSOI; and un-masking the medium and high voltage FET regions then forming second and third gate structures over the medium and high voltage FET regions, respectively, thereby forming medium and high voltage FETs over the ETSOI.

14. The method of claim 13, wherein the medium voltage FET region comprises a doped band formed below the channel, source, and drain structures of the medium voltage FET and wherein the high voltage FET region comprises a channel formed beneath the BOX insulating layer.

15. The method of claim 13, wherein the low voltage FET region comprises a channel formed beneath the BOX insulating layer.

16. The method of claim 13, wherein the first, second, and third masking layer segments comprise silicon nitride.

17. The method of claim 13, wherein the silicon base layer comprises p-type silicon and the source and drain ion implant regions of both the low, medium, and high voltage FETs comprise n-type silicon, or wherein the silicon base layer comprises n-type silicon and the source and drain ion implant regions of both the low, medium, and high voltage FETs comprise p-type silicon.

* * * * *